United States Patent
Reder et al.

(10) Patent No.: US 6,869,893 B2
(45) Date of Patent: Mar. 22, 2005

(54) LAMINATE LOW K FILM

(75) Inventors: Steven Reder, Boring, OR (US);
Michael Berman, West Linn, OR (US);
Rennie Barber, Gresham, OR (US)

(73) Assignee: LSI Logic Corporation, Milpitas, CA (US)

( * ) Notice: Subject to any disclaimer, the term of this patent is extended or adjusted under 35 U.S.C. 154(b) by 37 days.

(21) Appl. No.: 10/277,025

(22) Filed: Oct. 21, 2002

(65) Prior Publication Data

US 2004/0077179 A1 Apr. 22, 2004

(51) Int. Cl.$^7$ ................................................ H01L 21/31

(52) U.S. Cl. ..................................................... 438/778

(58) Field of Search ................................ 438/778, 687, 438/633, 623, 622, 619, 618, 243, 110, 789, 782, 780, 688, 382, 151; 257/666, 649

(56) References Cited

U.S. PATENT DOCUMENTS 6,610,593 B2 * 8/2003 Kohl et al. .................. 438/623

* cited by examiner

Primary Examiner—Carl Whitehead, Jr.
Assistant Examiner—Monica D. Harrison
(74) Attorney, Agent, or Firm—Trexler, Bushnell, Giangiorgi & Blackstone, LTD

(57) ABSTRACT

Application of an extremely low K material by the application of a laminate onto a wafer. The laminate preferably contains alternating layers of low K material and etch stop layers, and could be applied by rolling the laminate onto the wafer. An anneal process can be utilized to bond the film to the wafer. Conventional photo masking and etching techniques are then used to open vias and line areas in the film, and to deposit the next copper layer on the wafer. Electro polishing can be used to planarize or remove residual copper. Thereafter, an etch step can be performed to remove the excess material between the copper lines to leave an ultra low K region between the copper lines. The next layer of low K film can then be deposited, and the process repeated for all subsequent metal layering.

16 Claims, 2 Drawing Sheets

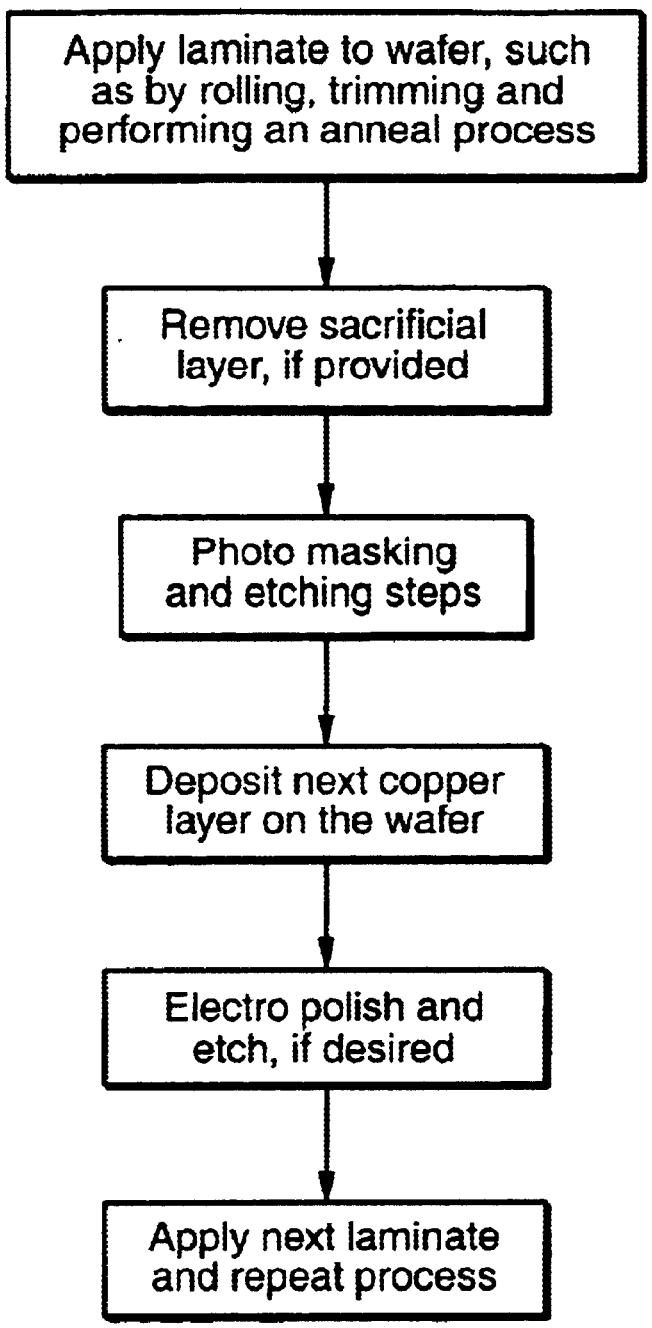
FIG._1

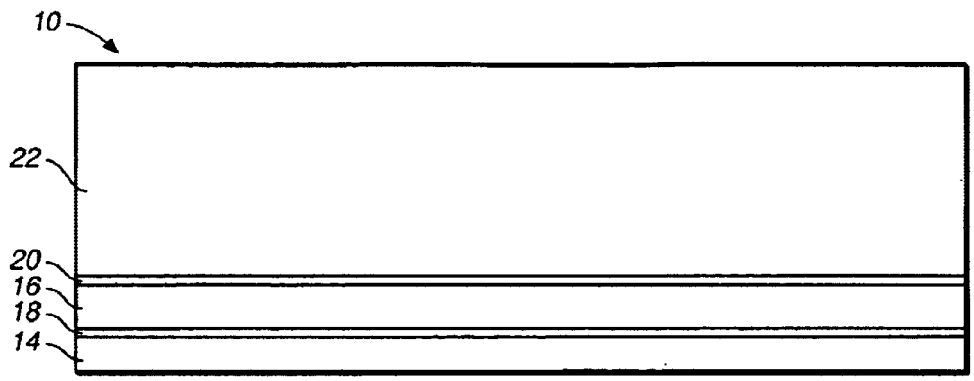
FIG._2
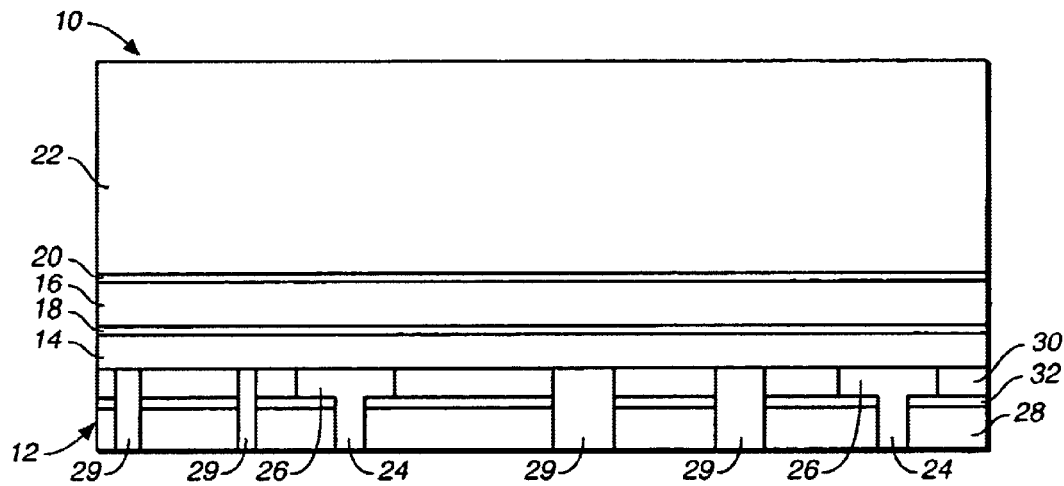
FIG._3
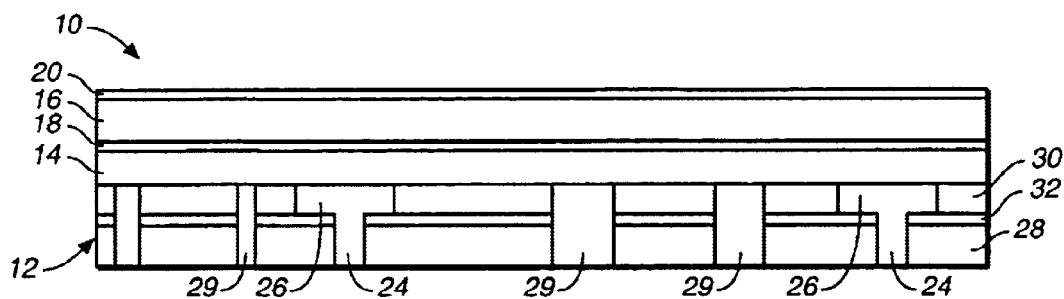
FIG._4

LAMINATE LOW K FILM

BACKGROUND

The present invention generally relates to semiconductor manufacturing processes, and more specifically relates to a method and apparatus for making a semiconductor wherein a low k film is laminated on a wafer.

A current problem in the semiconductor manufacturing industry is the inability to successfully integrate new low K materials (K<2.7) into sub 0.13 micron process nodes. The problem exists because materials which are currently being used cannot structurally handle repeated CMP processing. Specifically, the porosity of the materials delaminate or collapse.

Currently, this field is an area of large amounts of research and development. There are constantly new materials and process techniques being developed in an attempt to solve this problem. The documentation that is currently available questions the industry's ability to achieve the necessary process requirements to keep pace with the advancing technologies (i.e., 0.13, 0.09, 0.065 micron process nodes). One solution to this problem that has been attempted, and has been widely published, is the development of a replacement process for CMP, often referred to as "stress free polishing." This technique utilizes reverse electro plating technology, a technology which has existed (in other areas) for many years. By using reverse electro plating technology, a lower K material can be used, and the copper can be polished by this process as opposed to the more stressful and damaging CMP methods that cause damage to the low K films. Currently, this process is still in its development stages, and has yet been proven to be a viable and reliable process replacement for CMP.

A disadvantage of the new materials that have been developed recently is that they do not have the structural integrity and reliability to withstand repeated CMP polishes and maintain their topography. More porosity is needed to achieve the lower K value. Air has a K value of 1.0; therefore, to lower the K value of a film, air spaces need to be added. These spaces can become sources for residual contamination or collapse that can harm subsequent deposited film layers. They can also trap residuals from a liquid source deposition that can explode upon expansion during the heat treating of a film.

OBJECTS AND SUMMARY

A general object of an embodiment of the present invention is to provide for the application of low K material by using laminate film technology.

Another object of an embodiment of the present invention is to provide a method and apparatus where a low K region is provided between copper lines and vias on a wafer.

Another object of an embodiment of the present invention is to provide a method and apparatus where a laminate is applied to a wafer, where the laminate includes alternating layers of low K material and alternating etch stop layers.

Briefly, and in accordance with at least one of the foregoing objects, an embodiment of the present invention provides for the application of an extremely low K material (K<2.6) by the application of a laminate onto a wafer. Specifically, a pre-manufactured sheet of the material can be bonded or laminated on the top of the wafer. The material can be applied in a similar fashion to the tape which is applied to protect the front side of a wafer during the backgrind process. The film's thickness and layer composition is defined by the specific process necessary to achieve the integration requirements of the process. The film preferably contains alternating layers of low K material and etch stop or seal layers constructed in a manner that reflects the requirements of the copper wiring scheme being used. This film could be applied by rolling the film onto the wafer and then a trimming operation can be performed to cut the 'tape' to conform to the wafer edges. An anneal process can be utilized to bond the film to the wafer. This could be processed in a high pressure system to insure a better adhesion to the wafer. Conventional photo masking and etching techniques are then used to open the vias and line areas in the film. Conventional methods are also used to deposit the next copper layer on the wafer. Electro polishing can be used to planarize or remove residual copper. Thereafter, an etch step can be performed to remove the excess material between the copper lines to leave an ultra low K region between the copper lines. The next layer of low K film can then be deposited, and the process repeated for all subsequent metal layering.

Pillars of metal can be placed in "large" open areas, where they support the laminate film. The laminate film could also include a sacrificial layer, where the sacrificial layer gives the film the overall thickness it needs to be worked off the wafer. If a sacrificial layer is used, after the film is laminated to the wafer, the sacrificial layer is then removed, such as by heating or etching.

The present invention preferably eliminates the need for CMP planarization of the applied film, and provides that the ultra low K requirements necessary to achieve design requirements can be achieved without the current problems associated with current materials and equipment-related problems. The present invention preferably provides that several expensive process steps can be eliminated.

BRIEF DESCRIPTION OF THE DRAWINGS

The organization and manner of the structure and operation of the invention, together with further objects and advantages thereof, may best be understood by reference to the following description, taken in connection with the accompanying drawings, wherein:

FIG. 1 is a flow chart which illustrates a method which is in accordance with an embodiment of the present invention;

FIG. 2 is a cross-sectional diagram of a laminate film which is in accordance with an embodiment of the present invention, and which can be used in connection with the method illustrated in FIG. 1;

FIG. 3 shows the laminate film of FIG. 2 disposed on a wafer; and

FIG. 4 is similar to FIG. 3, but shows the structure after a sacrificial layer has been removed.

DESCRIPTION

While the invention may be susceptible to embodiment in different forms, there are shown in the drawings, and herein will be described in detail, specific embodiments with the understanding that the present disclosure is to be considered an exemplification of the principles of the invention, and is not intended to limit the invention to that as illustrated and described herein.

FIG. 1 shows a method which is in accordance with an embodiment of the present invention. The method includes applying a laminate or film to a wafer. As shown in FIG. 2, the laminate or film 10 may consist of a pre-manufactured sheet of material, where the laminate or film includes a plurality of layers, which together are applied to a wafer 12 as shown in FIG. 3. Specifically, the laminate 10 may include alternating layers of low K film 14, 16, such as carbon doped oxide films having a K value of less than 2.7, and etch stop layers 18, 20, such as SiC or SiN, where the layers are constructed in a manner that reflects the requirements of the copper wiring scheme being used. As shown in FIGS. 2 and 3, the laminate 10 may also include a sacrificial layer 22, where the sacrificial layer 22 works to give the film 10 the thickness it needs to be worked off the wafer. As shown in FIG. 4 (and in FIG. 1), after the film 10 is laminated to the wafer 12, the sacrificial layer 22 is removed, such as by heating or etching.

The laminate 10 may be applied in a similar fashion to the tape that is applied to protect the front side of a wafer during a backgrind process. Specifically, the film 10 could be applied by rolling the film 10 onto the wafer 12, and then a trimming operation can be performed to cut the film 10 to conform to the wafer edges. After the film 10 is applied to the wafer 12, an anneal process can be used to bond the film 10 to the wafer 12. This could be processed in a high pressure system to insure a better adhesion to the wafer. As shown in FIGS. 1, 3 and 4, after the film 10 has been applied, conventional photo masking and etching techniques can be used to open the vias 24 and line areas 26 in the film 10 (wherein in FIGS. 3 and 4, layers 28 and 30 are low K layers and layer 32 is an etch stop layer from the previous laminate). As shown in FIGS. 3 and 4, pillars 29 may also be formed to support a subsequent laminate applied to the wafer. Conventional methods can then be used to deposit the next copper layer on the wafer 12. Electro polishing can be used to planarize or remove residual copper, and an etch step can be used to remove the excess material between the copper lines 26 to leave an ultra low K region between the copper lines. As shown in FIG. 1, the next laminate (similar or identical to laminate 10) can then be deposited, and the process repeated for all subsequent metal layering. In FIGS. 3 and 4, layer 12 is a previous laminate which has been processed, and includes vias 24, lines 26 and pillars 29, and layer 10 is a subsequent layer to be processed (in accordance with FIG. 1).

Hence, the present invention provides for the application of low K material by laminate film technology. The excess film is preferably removed by conventional process techniques to leave an ultra low K region between the copper wiring layers. Preferably, the present invention eliminates the need for CMP planarization of the applied film, and provides that the ultra low K requirements necessary to achieve design requirements can be achieved without the current problems associated with current materials and equipment-related problems. Preferably, the present invention also provides that several expensive process steps can be eliminated.

The present invention provides a new and novel approach to achieving the low K requirements necessary for the sub 0.13 micron process nodes. Films other than Low K could be used, in such case preferably an alloy temperature cycle is used to adhere the laminate to the underlining metal lines and pillars.

While embodiments of the present invention are shown and described, it is envisioned that those skilled in the art may devise various modifications of the present invention without departing from the spirit and scope of the appended claims.

What is claimed is:

1. A method of processing a wafer comprising: applying a non-sacrificial laminate to the wafer, said non-sacrificial laminate including a plurality of layers, said plurality of layers including a layer of low K material and an etch stop layer; forming at least one line area and at least one via in the laminate; depositing copper on the laminate; and continuing to process said wafer wherein said wafer, upon being completely formed, includes at least a portion of at least one of the layers of said non-sacrificial laminate.

2. A method as recited in claim 1, further comprising applying a second laminate to the laminate on the wafer, said second laminate including a plurality of layers; forming at least one line area and at least one via in the second laminate; depositing copper on the second laminate.

3. A method as recited in claim 1, wherein said laminate includes a plurality of layers of low K material.

4. A method as recited in claim 1, wherein said laminate includes a plurality of etch stop layers and a plurality of layers of low K material.

5. A method as recited in claim 4, wherein said laminate includes a layer of low K material between two etch stop layers.

6. A method as recited in claim 1, wherein the stop of applying the laminate to the wafer comprising rolling the laminate onto the wafer, trimming the laminate to edges of the wafer and performing an anneal process to bond the laminate to the wafer.

7. A method as recited in claim 1, wherein the laminate includes a sacrificial layer.

8. A method as recited in claim 1, wherein the laminate includes a sacrificial layer and said method further comprises removing said sacrificial layer after said laminate has been applied to the wafer.

9. A method as recited in claim 1, wherein the step of forming at least one line area and at least one via in the laminate comprises performing at least one photo masking step and at least one etching step.

10. A method as recited in claim 1, further comprising performing an electro polish and etching step after depositing copper.

11. A method as recited in claim 1, further comprising forming at least one pillar in the laminate.

12. A method as recited in claim 1, wherein said layer of low K material has a K value of less than 2.7.

13. A wafer configuration comprising a non-sacrificial laminate comprising a first layer of low K material, a second layer of low K material, and a third layer disposed between the first and second layers, said third layer comprising an etch stop layer, at least one copper line on the first layer of low K material; and at least one via formed proximate the copper line, through the etch stop layer and second layer of low K material, further comprising a fourth layer, said fourth layer comprising a layer of low K material on the first layer of low K material, a fifth layer, said fifth layer on the fourth layer and comprising a stop etch layer, a sixth layer, said sixth layer on the fifth layer and comprising a layer of low K material; a seventh layer, said seventh layer on the sixth layer and comprising an etch stop layer.

14. A wafer configuration as recited in claim 13, further comprising at least one pillar formed through the first, second and third layers.

15. A wafer configuration as recited in claim 13, further comprising a layer of low K material on the first layer of low K material.

16. A wafer configuration as recited in claim 13, wherein said first and second layers have a K value of less than 2.7.

* * * * *